(12) United States Patent
Lee

(10) Patent No.: US 7,005,239 B2
(45) Date of Patent: Feb. 28, 2006

(54) METHOD OF FORMING METAL LINE

(75) Inventor: Hu Kag Lee, Kyongsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 183 days.

(21) Appl. No.: 10/319,620

(22) Filed: Dec. 16, 2002

(65) Prior Publication Data
US 2003/0121772 A1 Jul. 3, 2003

(30) Foreign Application Priority Data
Dec. 28, 2001 (KR) .............................. P2001-86763

(51) Int. Cl.
*C23C 14/32* (2006.01)
*C23C 14/02* (2006.01)
(52) U.S. Cl. ..................... 430/313; 430/320; 430/322; 430/323; 204/192.15; 204/192.36; 204/192.17; 216/58
(58) Field of Classification Search ................ 430/320, 430/322, 323; 204/192.17, 192.15; 216/58
See application file for complete search history.

(56) References Cited

U.S. PATENT DOCUMENTS 6,383,947 B1 * 5/2002 Besser et al. ............... 438/758

FOREIGN PATENT DOCUMENTS

| JP | 10-335452 | * 12/1998 |
|---|---|---|
| KR | 197127 | 2/1999 |

* cited by examiner

*Primary Examiner*—John A. McPherson
*Assistant Examiner*—Daborah Chacko-Davis
(74) *Attorney, Agent, or Firm*—McKenna Long & Aldridge LLP

(57) ABSTRACT

A method of forming a metal line includes the steps of forming a metal layer on a substrate in a chamber while maintaining a chamber pressure for a plasma to be equal to or smaller than 0.8 Pa, and coating a photoresist on the metal layer.

19 Claims, 9 Drawing Sheets

METHOD OF FORMING METAL LINE

This application claims the benefit of the Korean Application No. P2001-86763 filed in Korea on Dec. 28, 2001, which is hereby incorporated by reference in its entirety.

BACKGROUND OF THE INVENTION

1. Field of the Invention

The present invention relates to a method of forming a metal line, and more particularly to a method for forming a reliable line.

2. Discussion of the Related Art

As information society develops, so does the demand for various displays. Recently, many efforts have been made to research and develop various types of flat display panels, such as Liquid Crystal Display (LCD), Plasma Display Panel (PDP), Electroluminescent Display (ELD), Vacuum Fluorescent Display (VFD), and the like. Some of these flat display panels are already in use as displays in many different types of equipment. Typically, the LCD type of flat panel display is widely used as a substitution for the Cathode Ray Tube (CRT) for a mobile image display because of the characteristics or advantages of high quality image, lightness, shallow depth, compact size, and low power consumption. The LCD is also applicable for use in devices that receive video signals for display, such as television, computer monitor, and the like. However, in order to use an LCD device as a general display device in various fields, the LCD device should realize a high quality image at a high resolution, have high brightness and a wide screen as well as maintain the characteristics of lightness, shallow depth, compact size, and low power consumption.

An LCD device includes a liquid crystal display panel for displaying an image and a driving unit for applying a driving signal to the liquid crystal display panel. The liquid crystal display panel includes upper and lower substrates bonded to each other. A liquid crystal layer is in a space between the upper and lower substrates, which are both formed of glass. The lower substrate is also known as the Thin Film Transistor (TFT) substrate and upper substrate is also known as the color filter substrate.

A plurality of gate lines is formed on the lower substrate in one direction to leave a predetermined interval between each other. A plurality of data lines is arranged in another direction perpendicular to the gate lines to leave a predetermined interval between each other. A plurality of pixel electrodes is formed in a matrix structure within pixel areas defined between adjacent gate and data lines that cross over each other. A thin film transistor is provided in each of the pixel areas. The thin film transistor of each respective pixel area is switched by a signal of a gate line to transfer a signal from a data line to the pixel electrode of the respective pixel area.

A black matrix layer is formed on the upper substrate for cutting off light transmission through the upper substrate except where pixel areas are located. An RGB color filter layer for realizing colors is positioned adjacent the black matrix layer. A common electrode for creating vertical electric field is formed on the RGB color filter layer. In the alternative, the common electrode can be formed on the lower substrate if the device is a horizontal electric field type liquid crystal display device.

The upper and lower substrates are bonded to each other using a sealant while being separated from each other by spacers. The liquid crystal layer is positioned within the space surrounded by the sealant between the upper and lower substrates. The above-constituted general liquid crystal display device includes various electrode terminals and lines inside. For example, the various electrode terminals and lines include source/drain/gate electrodes of thin film transistors (TFTs) used as switching devices inside the liquid crystal cells, data lines for applying video data signals to the liquid crystal cells, gate lines for applying scan signals, and pixel/common electrodes for applying an electric field across the liquid crystal layer.

A method of fabricating such a liquid crystal display device includes a process of forming a TFT pattern by sputtering and patterning materials that are used as a gate or source/drain electrodes. For example, a gate forming process includes cleaning a substrate, depositing a gate layer by sputtering, performing a photolithographic process to form a mask on the gate layer, wet etching the gate layer using the mask to etch away the unwanted material, and removing the mask. In this case, the photolithographic process is carried out by coating a photoresist, exposing the photoresist with UV radiation and developing the photoresist such that the desired pattern is covered by the photoresist prior to the wet etch. In another example, the source/drain forming process is carried out by depositing a source/drain layer by sputtering, performing a photolithographic process to form a mask on the source/drain layer, wet etching the source/drain layer using the mask to remove unwanted material, and removing the mask. The photolithographic process of the source/drain forming process is similar to that of the gate forming process. However, in such a deposition process, the gate or source/drain electrode may not be deposited with a sufficient consistency or thickness to manufacture a reliable conductive metal line. A reliable conductive metal line is a line that does not have open-circuits or hot spots of high resistance that can later burn or separate into an open-circuit.

A method of forming a metal line according to the related art is explained by referring to the attached drawings as follows. FIG. 1 illustrates a diagram of sputtering according to the related art. Referring to FIG. 1, a metal 102 to be deposited is positioned on a backing plate 101. An Ar plasma 103 is generated in a chamber. The Ar plasma 103 causes Ar atoms to collide with the metal 102 such that atom clusters of the metal 102 are knocked off and are coated onto a substrate 100. In this case, the chamber pressure in the chamber for the Ar plasma is at least 0.8 Pa. The line degradation for manufacturing a metal line at pressures of 0.8 Pa or greater can be at least several tens of percentage points.

FIGS. 2A to 2C illustrate cross-sectional views of forming a metal line according to the related art. Referring to FIG. 2A, a metal 120 is deposited on a substrate 100 by sputtering. Referring to FIG. 2B, the metal is exposed to the atmosphere. As a result, an organic material 121 adheres to the exposed metal 120. The organic material 121 does not uniformly adhere to the metal 120, thus the surface of the metal 120 having the organic material 121 adhered thereto is uneven. Referring to FIG. 2C, a photoresist 130 is coated on the metal 120 having the organic material 121 adhered thereto. In this case, the organic material 121 inhibits the photoresist 130 from directly adhering to the metal 120, which causes the formation of unreliable or open-circuited metal lines. More particularly, the etchant used in the wet etch to etch away the unwanted metal also penetrates between the photoresist 130 and the organic material 121. Thus, the desired metal line is also etched or degraded.

Line degradation can cause either unreliable or open-circuited metal lines. For example, line degradation can be to the point where a line becomes an open-circuit. In the alternative, line degradation can cause hot spots or regions along the line having a high resistance. Accordingly, line degradation can hamper or prevent the operation of a device.

SUMMARY OF THE INVENTION

Accordingly, the present invention is directed to a method of forming a metal line that substantially obviates one or more of the problems due to limitations and disadvantages of the related art.

An object of the present invention is to provide a method of forming a metal line such that open-circuits are prevented.

Another object of the present invention is to provide a method of forming a reliable conductive metal line.

Additional advantages, objects, and features of the invention will be set forth in part in the description which-follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a metal line according to the present invention includes the steps of forming a metal layer on a substrate in a chamber while maintaining a chamber pressure for a plasma to be equal to or smaller than 0.8 Pa, and coating a photoresist on the metal layer.

In another aspect of the present invention, a method of forming a metal line according to the present invention includes the steps of forming a metal layer on a substrate, irradiating the metal layer with an excimer UV-ray and coating a photoresist on the metal layer.

In a further aspect of the present invention, a method of forming a metal line according to the present invention includes the steps of forming a metal layer on a substrate in a chamber while maintaining a chamber pressure for an Ar plasma to be equal to or smaller than 0.8 Pa, irradiating the metal layer with an excimer UV-ray and coating a photoresist on the metal layer.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
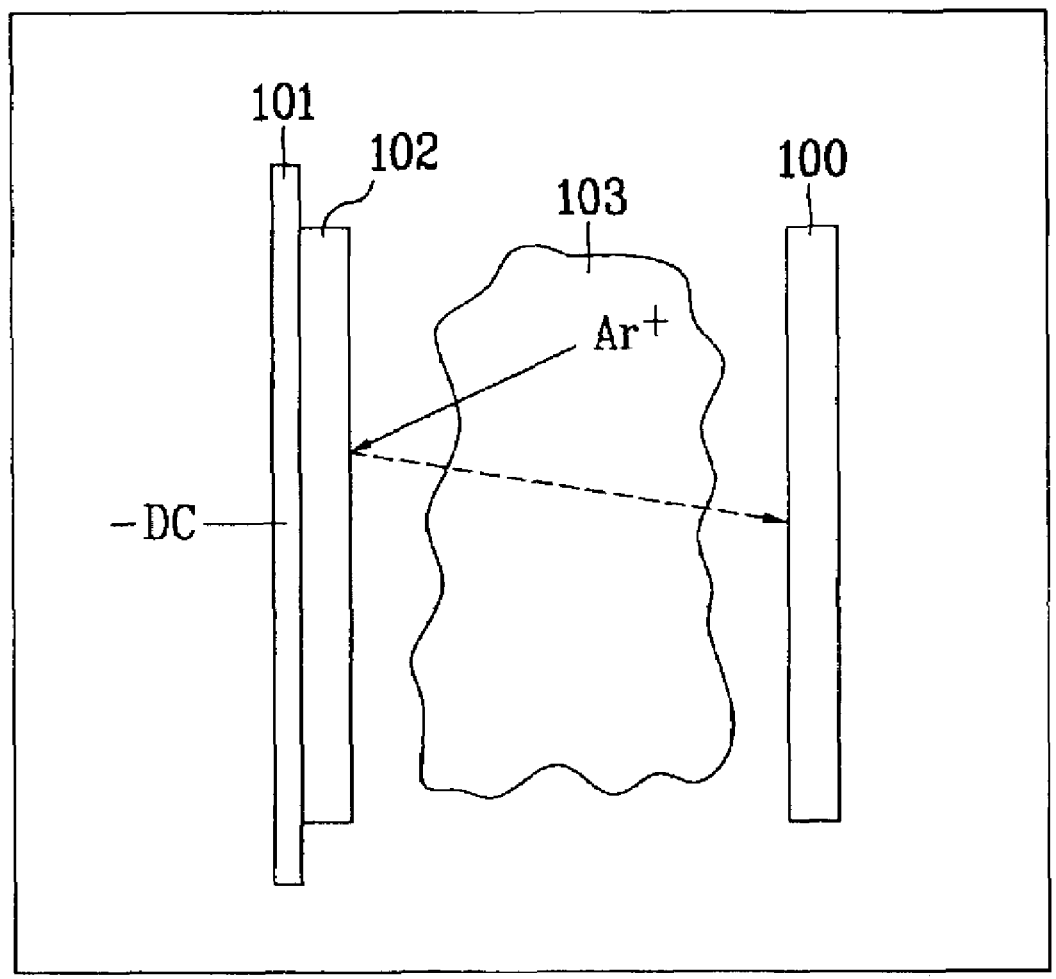
FIG. 1 illustrates a diagram of a sputtering process according to a related art.
Figure 2A:
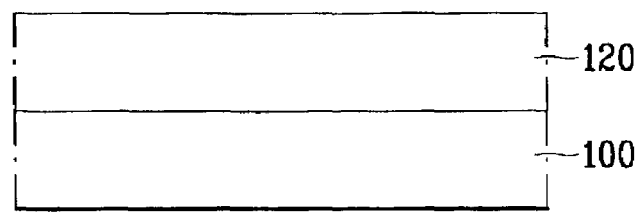
FIGS. 2A to 2C illustrate cross-sectional views of forming a metal line according to the related art.
Figure 2B:
Figure 2C:
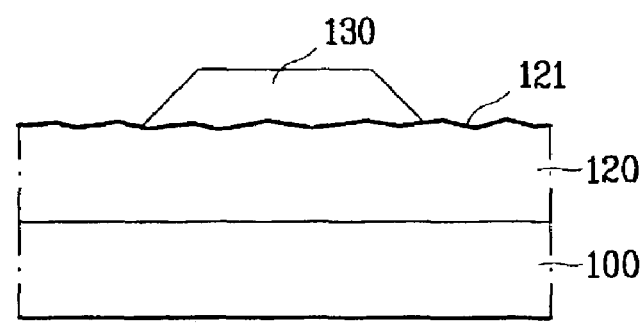
Figure 3:
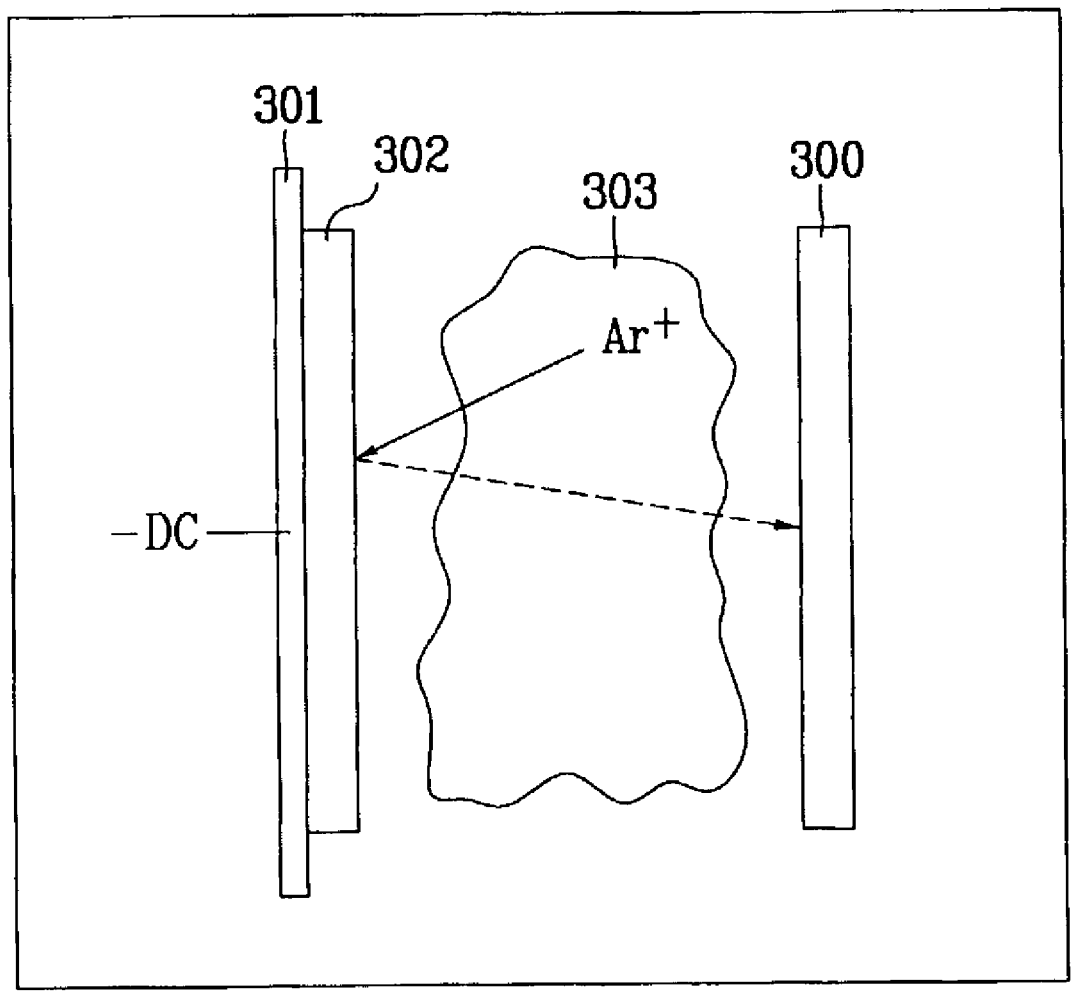
FIG. 3 illustrates a diagram of a sputtering process according to an embodiment of the present invention.

FIG. 3 illustrates a diagram of a sputtering process according to an embodiment of the present invention. Referring to FIG. 3, a metal 302 to be deposited is positioned on a backing plate 301. An Ar plasma 303 is generated in a chamber. The Ar plasma 303 causes Ar atoms to collide with the metal 302 such that atom clusters of the metal 302 are knocked off and coated onto substrate 300. In this example, the chamber pressure for the Ar plasma is equal to or below 0.8 Pa. When the chamber pressure for the Ar plasma is equal to or below 0.8 Pa, the line degradation of a deposited metal line is reduced greatly, thereby increasing its reliability. If the chamber pressure is not below 0.8 Pa, the metal line will not be consistently formed or sufficiently dense enough to prevent hot spots and/or open-circuits.

Figure 4:
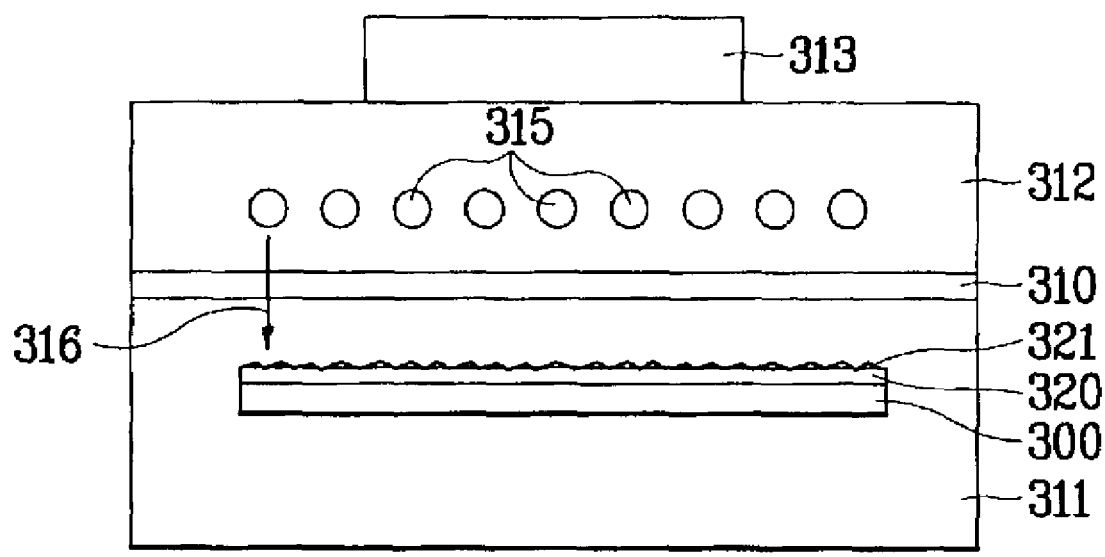
FIG. 4 illustrates a diagram of a UV-ray process according to an embodiment of the present invention.

FIG. 4 illustrates a diagram of a UV-ray process according to an embodiment of the present invention. Referring to FIG. 4, a UV-ray lamp 315 is installed over the quartz window 310 of a chamber 311. The UV-ray lamp 315 is controlled by a controller 313 and emits light in an atmosphere of nitrogen 312. A wavelength of the UV-ray lamp 315 is about 174 nm and the UV-ray lamp 315 is, for example, an excimer UV-ray lamp. A metal layer 320 deposited on a substrate 300 in an atmosphere of air is placed under the quartz window 310, and an organic material 321 adheres to the metal layer 320. The organic material 321 adheres to a surface of the metal layer 320 immediately when the deposited metal layer 320 is exposed to an air. The excimer UV-ray 316 changes oxygen in the air of the chamber 311 into ozone, and the ozone reacts with the organic material to produce carbon dioxide and water such that the excimer UV-ray 316 has the effect of cleaning the surface of the metal layer 320. More particularly, the excimer UV-ray 316 has an effect of removing the organic material 321. Subsequently there is a photolithographic process that includes coating a photoresist on the metal layer 320, exposing the photoresist with UV radiation and developing the photoresist such that the desired pattern is covered by the developed photoresist. The process is completed with a wet etch of the metal layer using the developed photoresist as a mask and removal of the developed photoresist.

Figure 5A:
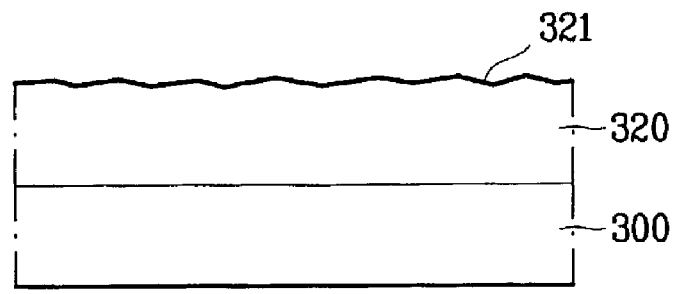
FIGS. 5A to 5C illustrate cross-sectional views of forming a metal line according to an embodiment of the present invention.
Figure 5B:
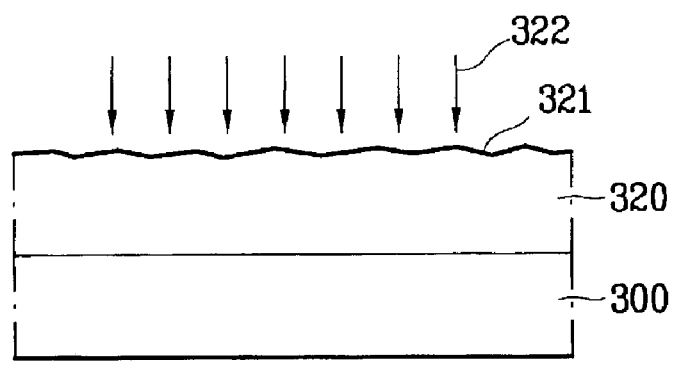
Figure 5C:
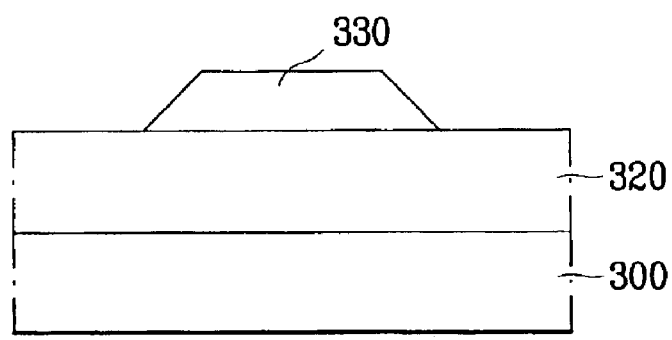

FIGS. 5A to 5C illustrate cross-sectional views of forming a metal line according to an embodiment of the present invention. Referring to FIG. 5A, a metal layer 320 is deposited on a substrate 300. When the metal layer 320 is exposed to an air, an organic material 321 adheres to a surface of the metal layer 320. Referring to FIG. 5B, when an excimer UV-ray 322 is applied to a surface of the organic material 321, the organic material decomposes and is removed such that the smooth surface of the metal layer 320 is revealed.

Referring to FIG. 5C, a photolithographic process is performed that includes coating a photoresist on the metal layer 320, exposing the photoresist with UV radiation and developing the photoresist such that the desired pattern is covered by the developed photoresist. As a result, a photoresist 330 adheres completely across the surface of the metal layer 320 without leaving any area in which the surface of the metal layer 320 and the photoresist 330 are not adhered to one another. More specifically, the metal layer 320 and the photoresist 330 are adhered such that an etchant cannot penetrate between the photoresist 330 and metal layer 320 during a wet etch to remove unwanted metal in the formation of a metal line. The process is completed with a wet etch of the metal layer using the developed photoresist as a mask and removal of the developed photoresist.

If the photoresist is coated within five hours after the metal layer 320 has been irradiated with the excimer UV-ray, the reliability of the metal line is greatly increased. Further, the above-explained method of forming the metal line according to the embodiment of the present invention includes the steps of depositing a metal by sputtering, applying an excimer UV-ray to the metal, and coating a photoresist on the metal. In the sputtering process of forming the metal layer 320 on the substrate 300, a chamber pressure of for an Ar plasma is maintained equal to or lower than 0.8 Pa and the photoresist is coated on the metal layer 320 after the irradiation of the excimer UV-ray. More specifically, if the chamber pressure for depositing metal is 0.2~0.5 Pa for the Ar plasma, the metal is irradiated with the excimer UV-ray and the photoresist is coated on the metal, the line degradation of the subsequently produced metal line is below 1%.

Moreover, if the chamber pressure of the Ar plasma is maintained below 0.8 Pa during the deposition of the metal, the line degradation of the subsequently produced metal lines is low even without the metal layer being irradiated by the excimer UV-ray. This is due to the chamber pressure for the Ar plasma being small such that the metal is deposited uniformly smooth on the substrate by the sputtering process. A uniformly smooth metal layer decreases the extent of adherence of the organic material. However, the sputtering process time is longer than it would be for the same metal layer at a higher chamber pressure. Even if the chamber pressure for an Ar plasma is greater than 0.8 Pa, the irradiation of the excimer UV-ray reduces the line degradation greatly by itself. Namely, the organic material adhering to the surface of the metal is removed by the excimer UV-ray to reduce line degradation due to the lack of a proper seal between the photoresist and the metal layer.

Most preferably, the chamber pressure for sputtering the metal layer with an Ar plasma is equal to or smaller than 0.8 Pa and the excimer UV-ray irradiates the metal. A photoresist is then, for example, sprayed onto the metal. Subsequently, the photoresist is patterned by exposure and development. The metal is then etched using the patterned photoresist as a mask to form the metal line.

Figure 6A:
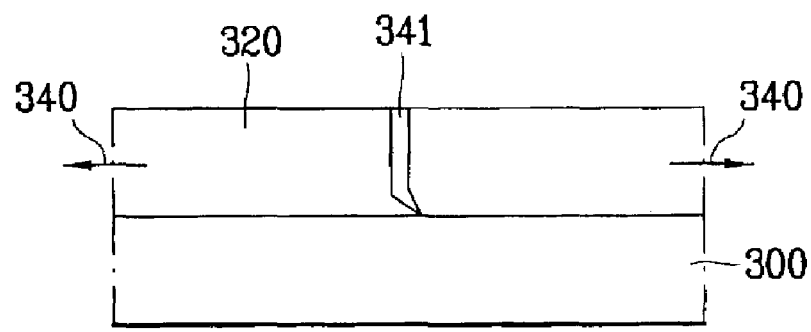
FIG. 6A and FIG. 6B illustrate data diagrams for the relation between a stress and a sputtering pressure for embodiments of the present invention.
Figure 6B:
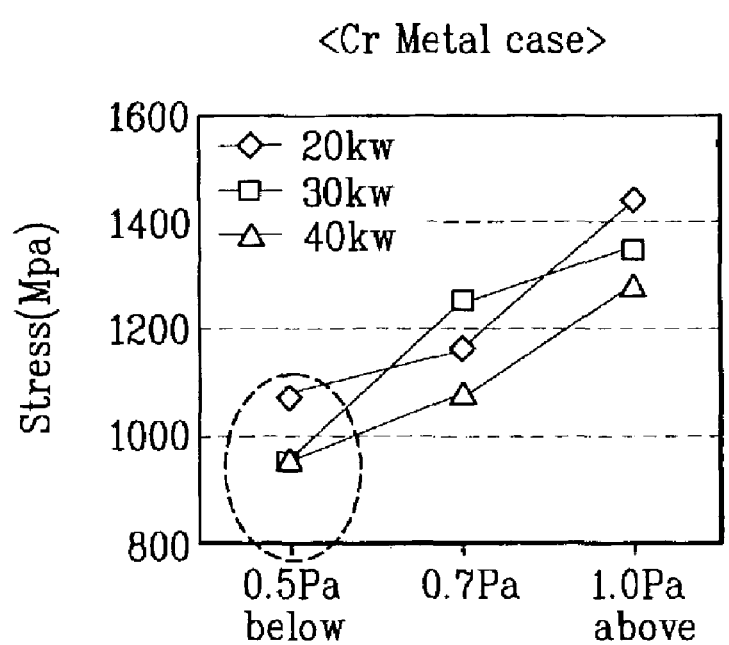

FIG. 6A and FIG. 6B illustrate data diagrams for the relation between a stress and a sputtering pressure for embodiments of the present invention. Hereinafter, a case that uses Cr as the metal is referred to in the following data. Of course, other metals, such as Al, Ti and the like, as well as polysilicon can be used. The line degradation is checked after the excimer UV-ray irradiation and the photolithographic process have been carried out.

The tensile stress increase of the metal line is in proportion to the chamber pressure during sputtering. When the chamber pressure for the Ar plasma increases, cracks are generated in the metal. As shown in FIG. 6A, when a crack 341 occurs on a surface of the metal layer 320 due to tensile force 340, an etchant can penetrate through the crack 341 after the photolithography and during a wet etch to cause increased line degradation.

Referring to FIG. 6B, once a chamber pressure for an Ar plasma is decreased, the tensile stress of the deposited metal layer decreases. Further, if the chamber pressure is 0.2~0.5 Pa, the stress is decreased to a point, regardless of DC potential applied during sputtering, that the line degradation becomes less than 1%.

Figure 7:
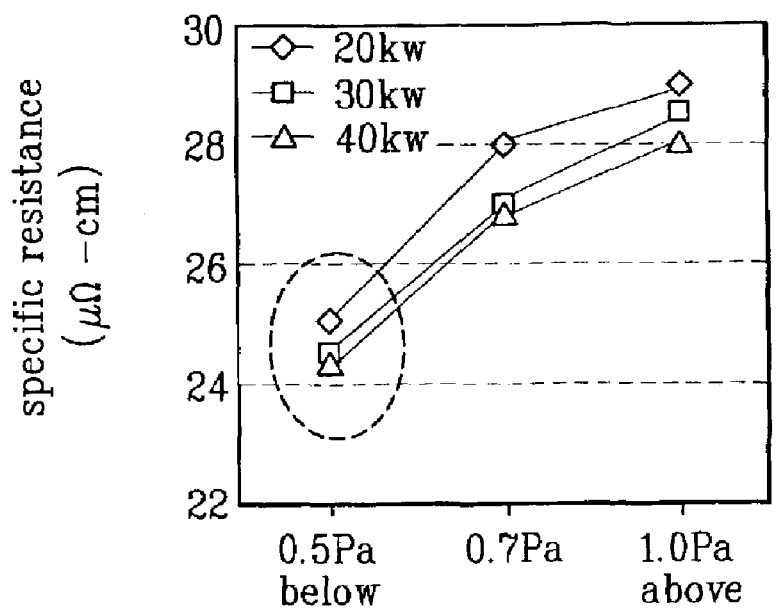
FIG. 7 illustrates a graph of a relation between a specific resistance and a sputtering pressure for embodiments of the present invention.

FIG. 7 illustrates a graph of a relation between a specific resistance and a sputtering pressure for embodiments of the present invention. The line degradation is checked after the deposition, the excimer UV-ray irradiation, and the photo process have been carried out. Referring to FIG. 7, when a chamber pressure for an Ar plasma is decreased, the specific resistance of the deposited metal is reduced. If the chamber pressure for an Ar plasma is decreased to be equal to or smaller than 0.8 Pa, the specific resistance is reduced. Most preferably, the chamber pressure for the Ar plasma is set to 0.2~0.5 Pa such that the specific resistance is reduced regardless of the DC potential used in sputtering. Hence, the line degradation becomes equal to or lower than 1%. In this case, the specific resistance is sufficiently reduced according to the decrease of the chamber pressure since the damage caused on the metal layer by Ar atoms, which are used to knock off clusters of atoms, is less due to the pressure reduction. If the damage on the metal layer is reduced, the line degradation is decreased.

Figure 8A:
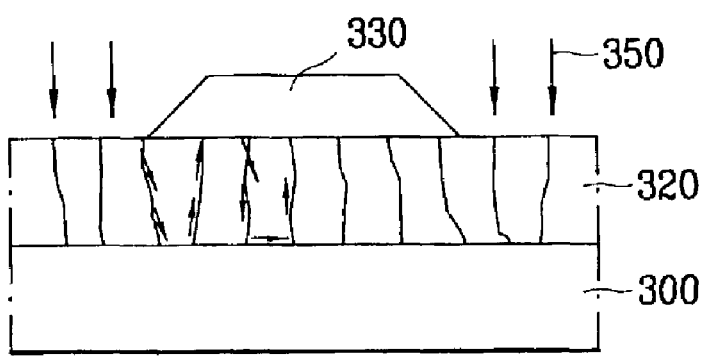
FIG. 8A and FIG. 8B illustrate data diagrams for the relation between a metal etch rate and a sputtering pressure for embodiments of the present invention.
Figure 8B:
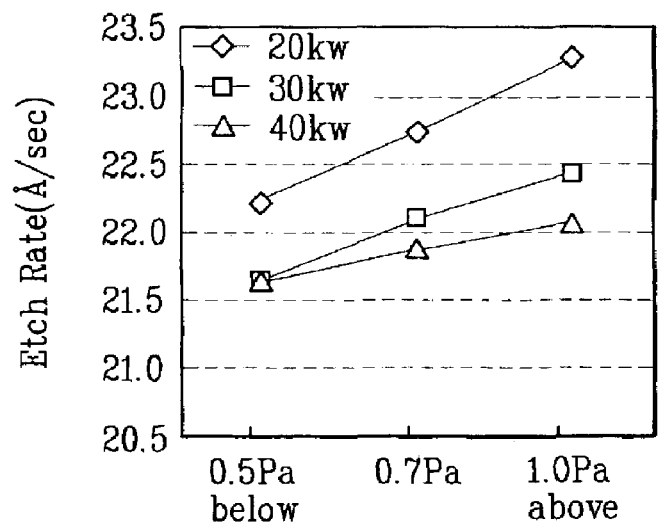

FIG. 8A and FIG. 8B illustrate data diagrams for the relation between a metal etch rate and a sputtering pressure according to embodiments of the present invention. The line degradation is checked after the deposition, the excimer UV-ray irradiation, and the photo process have been carried out. Referring to FIG. 8A, a metal layer 320 is deposited on a substrate 300, a photoresist 330 is coated on the metal layer 320, and the photoresist 330 is patterned by exposure and development. When the metal layer 320 is wet-etched, a grain boundary of the metal layer 320 is initially etched. Hence, if the grain boundary increases, an etch rate increases. If the etch rate increases, the line degradation increases.

In other words, if the chamber pressure for an Ar plasma is reduced, as shown in FIG. 8B, the etch rate is decreased. The chamber pressure for an Ar plasma is decreased to reduce the grain boundary per unit area of the metal so that the damage caused by the etchant is reduced. Accordingly, line degradation is reduced. If the chamber pressure for an Ar plasma is maintained to be equal to or lower than 0.8 Pa, then the etch rate is reduced that decreases the line degradation.

Figure 9:
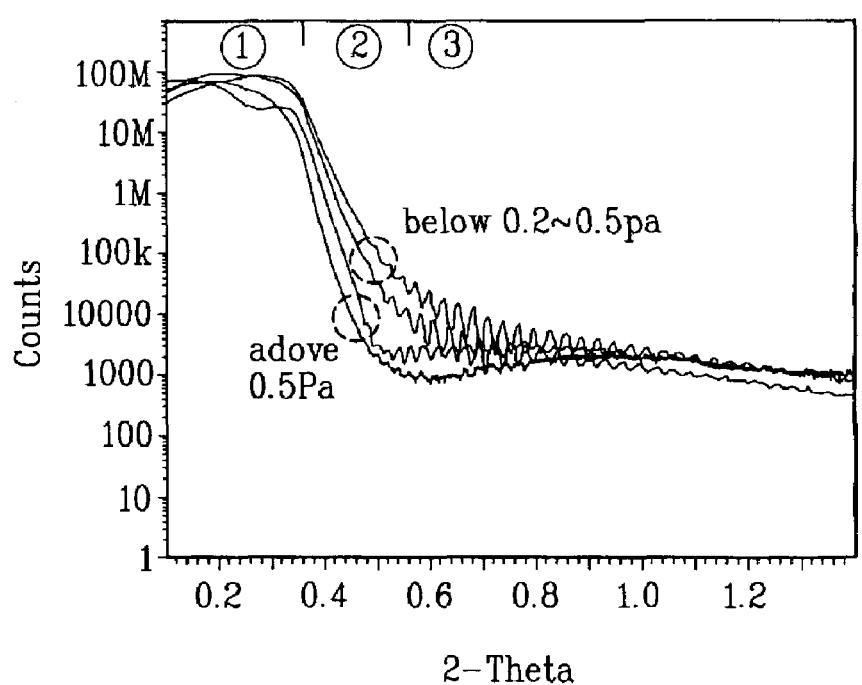
FIG. 9 illustrates a graph of an HR-XRD analysis result according to a sputtering pressure for embodiments of the present invention.

FIG. 9 illustrates a data graph of an HR-XRD analysis result according to a sputtering pressure for embodiments of the present invention. The line degradation is checked after the deposition, the excimer UV-ray irradiation, and the photo process have been carried out. Referring to FIG. 9, HR-XRD equipment determines the roughness, thickness, and density of a metal layer. If chamber pressure for an Ar plasma is reduced, the roughness decreased. Further, an oxide layer or the like is barely formed on a surface of the metal since the metal is so smooth. Furthermore, the decreases in roughness enhances adhesion between the metal and photoresist, thereby preventing line degradation.

As shown in FIG. 9, an area 1 indicates a smooth surface at the Ar plasma pressure below 0.5 Pa and has the minimum line degradation. As also shown in FIG. 9, an area 2 depicts a density of the metal layer and shows no difference of density at the chamber pressure below 0.5 Pa. As further shown in FIG. 9, an area 3 indicates a roughness. If such an area 3 is repeated periodically, the roughness decreases. If an irregular waveform shows up, the roughness increases. Therefore, as the chamber pressure is reduced, the roughness reduces, preventing line degradation.

Figure 10A:
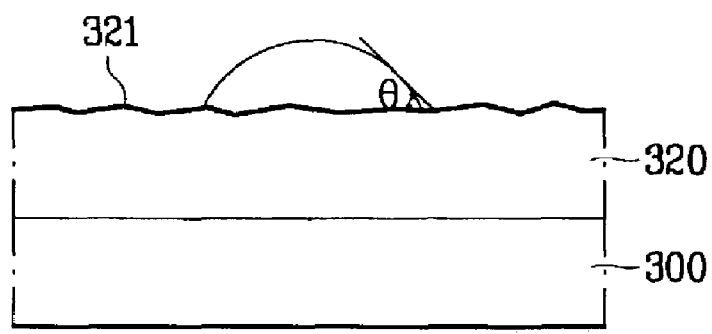
FIG. 10A and FIG. 10B illustrate diagrams of a result of UV-ray for embodiments of the present invention.
Figure 10B:
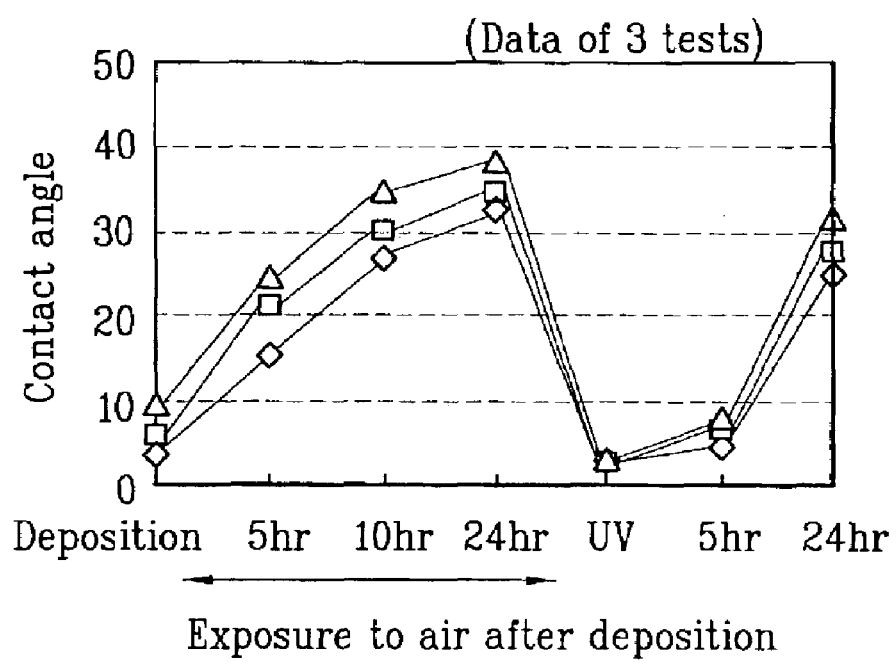

FIG. 10A and FIG. 10B illustrate diagrams of a result of UV-ray use according embodiments for the present invention. The line-opening degradation is checked after the deposition, the excimer UV-ray irradiation, and the photo process have been carried out. Referring to FIG. 10A, a metal layer 320 is deposited on a substrate 300. An organic material 321 then adheres to the metal layer 320. A large contact angle θ of a water droplet, which shows that surface of the metal layer is exhibiting a hydrophobic property, results from the adhesion of the organic material 321. A photoresist will not easily adhere to a metal layer 320 exhibiting a hydrophobic property. The excimer UV-ray irradiates the metal layer 320 to remove the organic material 321 and results in a small contact angle θ, which shows that surface of the metal layer is exhibiting a hydrophilic property. Hence, the adhesion between the photoresist and metal is improved when the metal layer has a hydrophilic property. The improved adhesion between the photoresist and the metal layer prevents the etchant from penetrating during the wet etch and thus prevents line degradation due to etchant seepage between the photoresist and the metal layer.

Referring to FIG. 10B, the organic material adheres to the metal layer as time goes by. Hence, the contact angle θ increases. If the excimer UV-ray is applied to the metal when the contact angle θ is large, the contact angle θ can be again be made small. Hence, if the metal layer is irradiated with the excimer UV-ray at anytime after the sputtering process, the organic material is removed. After the irradiation of the excimer UV-ray, the metal layer can be patterned with minimal line degradation due to etchant seepage between the photoresist and the metal layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a metal line, comprising the steps of:
    forming a metal layer on a substrate in a chamber while maintaining a chamber pressure for a plasma to be equal to or smaller than 0.8 Pa;
    irradiating the metal layer with an excimer UV-ray so as to remove organic material on the metal layer; and
    coating a photoresist on the metal layer.

2. The method of claim 1, wherein forming a metal layer includes sputtering.

3. The method of claim 1, further comprising the step of emitting a UV-ray toward the metal layer in a nitrogen atmosphere before the step of coating a photoresist.

4. The method of claim 3, wherein the UV-ray has a wavelength of about 174 nm.

5. The method of claim 3, wherein the photoresist is coated on the metal layer within five hours after the excimer UV-ray has irradiated the metal layer.

6. The method of claim 1, further comprising the steps of:
    exposing and developing the photoresist;
    etching the metal layer using the developed photoresist as a mask; and
    removing the developed photoresist.

7. A method of forming a metal line, comprising the steps of:
    forming a metal layer on a substrate;
    irradiating the metal layer with an excimer UV-ray so as to remove organic material on the metal layer; and
    coating a photoresist on the metal layer.

8. The method of claim 7, wherein forming a metal layer includes sputtering.

9. The method of claim 8, wherein the sputtering includes an Ar plasma.

10. The method of claim 7, wherein the UV-ray is emitted in a nitrogen atmosphere.

11. The method of claim 7, wherein the UV-ray has a wavelength of about 174 nm.

12. The method of claim 7, wherein the photoresist is coated on the metal layer within five hours after the excimer UV-ray has irradiated the metal layer.

13. The method of claim 7, further comprising the steps of:
    exposing and developing the photoresist;
    etching the metal layer using the developed photoresist as a mask; and
    removing the developed photoresist.

14. A method of forming a metal line, comprising the steps of:
    forming a metal layer on a substrate in a chamber while maintaining a chamber pressure for an Ar plasma to be equal to or smaller than 0.8 Pa;
    irradiating the metal layer with an excimer UV-ray so as to remove organic material on the metal layer; and
    coating a photoresist on the metal layer.

15. The method of claim 14, wherein forming the metal layer includes sputtenng.

16. The method of claim 14, wherein the UV-ray is emitted in a nitrogen atmosphere.

17. The method of claim 14, wherein the UV-ray has a wavelength of about 174 nm.

18. The method of claim 14, wherein the photoresist is coated on the metal layer within five hours after the excimer UV-ray has irradiated the metal layer.

19. The method of claim 14, further comprising the steps of:
    exposing and developing the photoresist;
    etching the metal layer using the developed photoresist as a mask; and
    removing the developed photoresist.

* * * * *